US006861717B2

(12) United States Patent
Hauenstein

(10) Patent No.: US 6,861,717 B2
(45) Date of Patent: Mar. 1, 2005

(54) DEVICE FOR DEFECTING A MAGNETIC FIELD, MAGNETIC FIELD MEASURE AND CURRENT METER

(75) Inventor: M. Henning Hauenstein, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 110 days.

(21) Appl. No.: 10/221,090

(22) PCT Filed: Dec. 8, 2001

(86) PCT No.: PCT/DE01/04633

§ 371 (c)(1),
(2), (4) Date: Nov. 14, 2002

(87) PCT Pub. No.: WO02/056046

PCT Pub. Date: Jul. 18, 2002

(65) Prior Publication Data

US 2003/0183848 A1 Oct. 2, 2003

(30) Foreign Application Priority Data

Jan. 9, 2001 (DE) ........................ 101 00 598

(51) Int. Cl.[7] .............................................. H01L 29/82
(52) U.S. Cl. ...................... 257/421; 257/426; 257/427; 257/470; 360/46

(58) Field of Search ................................ 257/421, 426, 257/427, 470, 422, 552; 360/46

(56) References Cited

U.S. PATENT DOCUMENTS

| 5,179,429 | A |   | 1/1993 | Ristic |
| 5,514,899 | A |   | 5/1996 | Lau et al. |
| 5,654,566 | A | * | 8/1997 | Johnson ........................ 257/295 |
| 6,181,496 | B1 | * | 1/2001 | Price, Jr. ....................... 360/46 |
| 6,205,047 | B1 | * | 3/2001 | Ogino .......................... 365/145 |

FOREIGN PATENT DOCUMENTS

GB        1 280 719          7/1972

OTHER PUBLICATIONS

*Trujillo, H., et al., "Merged Lacteral Bipolar Magnetotransistors," Sensors & Actuators A, Elsevier Science, Lausanne, 50:3, pp. 177–181 (Sep. 1, 1995). ISSN 0924-4247.

* cited by examiner

Primary Examiner—David Nelms
Assistant Examiner—Mai-Huong Tran
(74) Attorney, Agent, or Firm—Kenyon & Kenyon

(57) ABSTRACT

A device for detecting a magnetic field, e.g., a magnetic field meter and an ammeter are described, the device having a first lateral magnetotransistor and a second lateral magnetotransistor, and in which the first and the second lateral magnetotransistors are complementary.

10 Claims, 1 Drawing Sheet

DEVICE FOR DEFECTING A MAGNETIC FIELD, MAGNETIC FIELD MEASURE AND CURRENT METER

FIELD OF THE INVENTION

The present invention relates to a device for detecting a magnetic field, and particularly relates to a magnetic field meter and an ammeter.

BACKGROUND INFORMATION

The number and range of applications for magnetic field sensors is growing steadily, in the automotive industry in particular. Among other things, magnetic field measurement may be used for the non-contact, low-loss, and potential-free measurement of currents. Examples include the determination of electrical operating parameters of generators and electrical drives. In general, currents from the milliampere to the kiloampere range must be measured, which requires a measuring range of five to six orders of magnitude.

The devices known today measure magnetic fields of current conductors, for example, by using magnetic field sensors such as Hall sensors, bipolar magnetotransistors, magnetoresistive resistors, lateral magneto-FET structures, etc. A particularly sensitive component is the lateral magnetotransistor, the function of which is based on the asymmetrical current distribution generated by the magnetic field between two bipolar transistors.

For currents in the milliampere range, even such components reach the limits of their sensitivity due to the low magnetic fields, typically in the $\mu T$ range. For that reason, in the related art, low magnetic fields are amplified by flux concentrators which make the magnetic fields stronger at the site of the magnetic field sensors through suitable shaping of the current conductors or through magnetic circuits made of highly permeable materials.

SUMMARY OF THE INVENTION

The device according to the present invention for detecting a magnetic field, the magnetic field meter of the present invention and the ammeter according to the present invention do not require the use of flux concentrating devices, which saves costs and reduces the space requirements. This is made possible by increasing the sensitivity of the device of the present invention. In doing so, the linear relationship between the measuring signal and the magnetic field to be measured is largely preserved.

In one aspect, the present invention relates to a device for detecting a magnetic field, a magnetic field meter, and an ammeter that consist of lateral magnetotransistors that are complementary in that the first lateral magnetotransistor is of the npn type and the second lateral magnetotransistor is of the pnp type. This makes it possible to provide two complementary lateral magnetotransistors by simple means. As a result, the complementary lateral magnetotransistors may also be used for an automatic offset compensation or temperature compensation.

In another aspect, the present invention relates to a device for detecting a magnetic field, a magnetic field meter, and an ammeter that consist of a first lateral magnetotransistor that has a first output and a second output, a second lateral magnetotransistor that has a third and a fourth output, and in which the first and third outputs are connected using low resistance, the second and the fourth outputs are connected using low resistance and a measuring bridge is provided between the first and the fourth outputs. This makes it possible to pick off a voltage or a current across the measuring bridge directly on the semiconductor chip, on which the lateral magnetotransistors are implemented without the need for additional shunt resistors or an external circuit. The signal-to-noise ratio is thus improved compared to an LMT sensor having a single lateral magnetotransistor. The measuring bridge is highly sensitive and may therefore be adjusted very accurately, for example, by a zero adjustment without an external magnetic field. In addition, the measuring bridge balancing, e.g., offset compensation, may be performed very simply, for example, via slight changes in the working point of one of the lateral magnetotransistors involved. Temperature drifts may be similarly compensated.

In another aspect, the present invention relates to a device for detecting a magnetic field, a magnetic field meter, and an ammeter in which the lateral magnetotransistors are monolithically integrated. As a result, it is possible to implement the complementary lateral magnetotransistor sensor arrangement on one chip, resulting in a highly sensitive sensor element. In addition, this also makes it possible to provide an evaluation circuit on the chip which is used to amplify the measuring bridge signal. In addition, the implementation of the complementary lateral magnetotransistors requires no substantial additional expense in production.

DETAILED DESCRIPTION OF THE INVENTION

Figure 1:
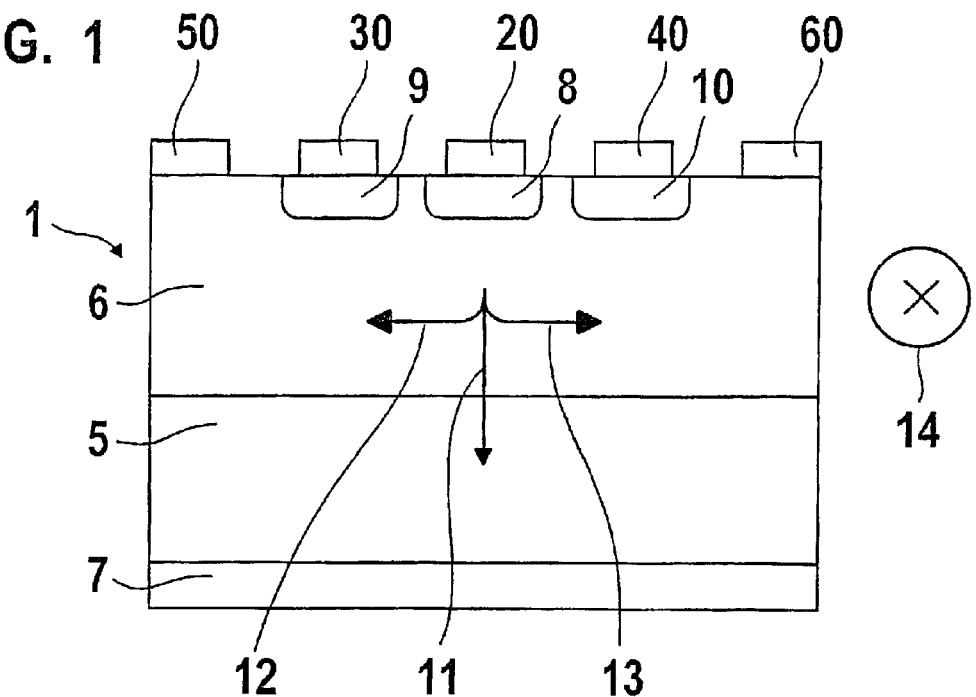
FIG. 1 shows a lateral magnetotransistor.

A lateral magnetotransistor 1 is shown in FIG. 1. Lateral magnetotransistor 1 is also abbreviated as LMT 1. LMT 1 includes a first semiconductor substrate layer 5 which is negatively doped in an npn type LMT. In addition, LMT 1 has a second semiconductor substrate layer 6 which is positively doped for the npn type. A first metal plating layer 7 is provided beneath first semiconductor substrate layer 5 for bonding. First metal plating layer 7 forms the vertical collector of LMT 1. A first semiconductor substrate area 8 is embedded in second semiconductor substrate layer 6, the semiconductor substrate area being negatively doped in the npn type and positively doped in the pnp type. In addition, a second semiconductor substrate area 9 is embedded adjacent to first semiconductor substrate area 8 and a third semiconductor substrate area 10 is embedded in second semiconductor substrate layer 6, first semiconductor area 8 being situated in the middle between semiconductor substrate area 9 and third semiconductor substrate area 10. Second and third semiconductor substrate areas 9, 10 are also doped like first semiconductor substrate area 8. A first metallic bonding 20 is situated above second semiconductor substrate area 8, the first metallic bonding forming the emitter contact of LMT 1. A second metallic bonding 30 is provided above second semiconductor substrate area 9, the second metallic bonding forming a first collector of the LMT. A third metallic bonding 40 is provided above third semiconductor substrate are 10, the third metallic bonding forming a second collector of LMT 1. In addition to second metallic bonding 30, a fourth metallic bonding 50 is located on the side opposite first metallic bonding 20, the fourth metallic bonding forming a first base terminal of LMT 1. In addition to third metallic bonding 40, a fifth metallic bonding 60 is located opposite first metallic bonding 20, the fifth metallic bonding forming a second base terminal of LMT 1.

FIG. 1 shows the current directions of various currents that flow when an npn type LMT 1 is operated. For a pnp type, the current directions will be reversed. In npn type LMT 1, a first current 11 flows vertically downwards from emitter area 8, i.e., from first semiconductor substrate area 8. First current 11 corresponds to the input current of LMT 1, which is fed via emitter terminal 20. During operation, collector terminals 30, 40 are connected to the same potential and a second current 12 flows from emitter area 8 to second collector area 9, i.e., to second semiconductor substrate area 9 and in addition, a third current 13 flows from emitter area 8 to third collector area 10, i.e., to third semiconductor substrate area 10. In the absence of a magnetic field 14, second current 12 and third current 13 are of equal magnitude. In the presence of a magnetic field 14 having a component pointing vertically into the plane of the illustration, which is suggested by a cross in magnetic field 14, first and second currents 12, 13 are unbalanced: one of the currents becomes larger.

Figure 2:
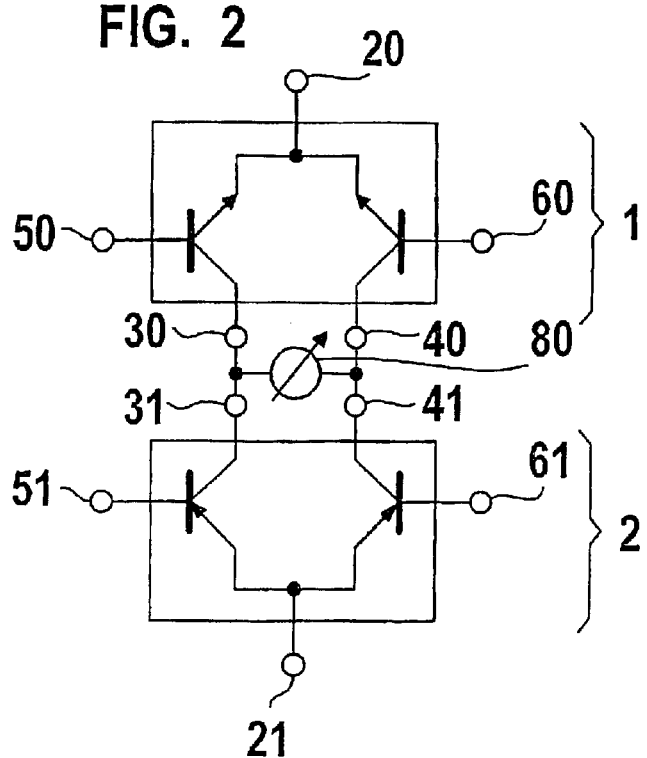
FIG. 2 shows a schematic equivalent circuit diagram for a combination of two complementary lateral magnetotransistors having a bridge arrangement.

A schematic equivalent circuit diagram of a combination of two complementary LMT elements is shown in FIG. 2. A first LMT 1 is of the npn type and a second LMT 2 is of the pnp type. First LMT 1 has the reference symbols known from FIG. 1, the emitter being 20, the first base terminal 50 and the second base terminal 60, the first collector terminal 30 and the second collector terminal 40. Second LMT 2 has a complementary structure that, according to the present invention, is of a pnp type in particular. Second LMT 2 therefore has an emitter 21, a first base terminal 51 and a second base terminal 61 as well as a first collector 31 and a second collector 41. First LMT 1 has a first output and a second output and second LMT 2 has a third output and a fourth output. According the present invention, first collector 30 of first LMT 1 forms the first output; furthermore, second collector 40 of first LMT 1 forms the second output; furthermore, first collector 31 of second LMT 2 forms the third output and second collector 41 of second LMT 2 forms the fourth output. The first two collectors 30, 31 of the two LMTs 1, 2 are connected using low resistance, which means that the first and the third outputs are connected using low resistance. In addition, the two collectors 40, 41 of LMTs 1, 2 are connected using low resistance, which means that the second and fourth outputs are connected using low resistance. In addition, the first output and the fourth output (or conversely) as well as the second output and the third output are connected to each other by a measuring bridge 80. Vertical collector 7 of LMT 1 is not shown in FIG. 2 because it is not absolutely needed for the description of the circuit's function or for the basic LMT function.

The four emitter-collector resistors of the two LMT elements 1, 2 form a measuring bridge, which is balanced, for example, without an external magnetic field 14. In this configuration, any change due to the presence of a magnetic field may be determined very precisely.

In principle, it is possible to assemble the circuit from discrete components. In one embodiment, the device according to the present invention implements the complementary LMT arrangement on a single chip. A feature of the present invention is that it is possible to pick off the signal either as a current or as a voltage using the measuring bridge. A conventional LMT sensor according to the related art generally requires external resistors at the output of the lateral collectors in order to measure the voltage drop of the collector currents and to determine the changes induced by the magnetic field from it. The consequences are generally a deterioration of the signal-to-noise ratio due to the external circuit, caused, for example, by the thermal noise. In a complementary LMT sensor chip, it is possible to avoid these effects using the measuring signal which is directly available at bridge 80. Therefore, not only is the sensitivity higher but the signal-to-noise ratio is better than in an individual LMT element.

Figure 3:
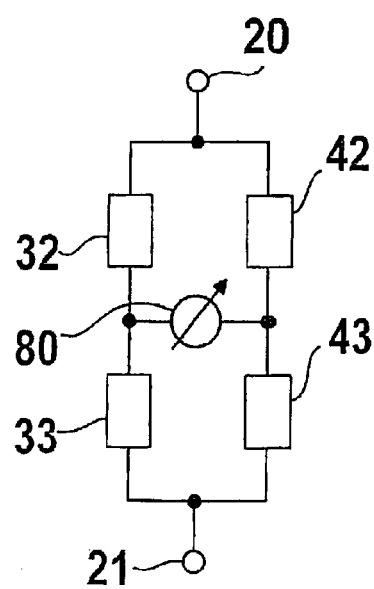
FIG. 3 shows simplified equivalent circuit diagram for the bridge arrangement.

An extremely simplified equivalent circuit diagram for the bridge arrangement is shown in FIG. 3. The resistor between emitter terminal 20 and first collector terminal 30 of first LMT 1 corresponds to a first emitter-collector resistor 32. The resistor between emitter terminal 20 and second collector terminal 40 of first LMT 1 corresponds to a second emitter-collector resistor 42. In addition, the resistor between emitter 21 and first collector terminal 31 of second LMT 2 corresponds to a third emitter-collector resistor 33. In addition, the resistor between emitter terminal 21 and second collector terminal 41 of second LMT 2 corresponds to a fourth emitter-collector resistor 43. In the presence of an external magnetic field 14 lateral to the chip surface, the current distributions between first collector 30, 31 and second collector 40, 41 change in both LMTs 1, 2. This corresponds to a resistance change of the collector-emitter paths 32, 42, 33, 43 in FIG. 3. Depending on the application, the two complementary LMTs 1, 2 are to be suitably aligned with the magnetic field 14 to be measured. The effect of the magnetic field 14 on resistance measuring bridge 80 may be selected depending on the application via the relative position of complementary LMTs 1, 2, for example, via the chip layout or by using suitable electric linking of collectors 30, 40 or 31, 41.

If the electrical connection of insulated npn type and pnp type LMTs 1, 2 is not produced by bonding wires, lead frames, flex film, etc. until after the chip is produced, it is then possible, for example, to manufacture a universal sensor element, whose measuring bridge is connected later, corresponding to the conditions of use. Also conceivable is a chip having several differently aligned npn type and pnp type LMT elements, two of which, for example, are selected and connected to form a suitable measuring bridge as a function of the application requirement.

Since at least two LMT sensors 1, 2 are involved in the bridge circuit, it is possible to implement different measuring methods. Both LMT elements 1, 2 may be arranged in such a way that they are exposed to the same magnetic field 14, as a result of which the effect of the field is additive. However, the sensors may also be placed in such a way that they "see," i.e., detect different magnetic fields, for example, for a differential or a reference measurement. Depending on the application, therefore, it is possible to use the bridge circuit of the present invention in a very flexible manner.

High standards for precision and resolution set similarly high standards for stability and the balancing of the zero point offset of a sensor. The present high-precision measuring bridge arrangement is suited for precise balancing requirements in a particularly advantageous manner. In addition, the offset and the temperature drift may be compensated in a relatively simple manner by a slight adaptation of the working point of one of the four collector-emitter paths 32, 42, 33, 43.

According to the present invention, LMT components having no substrate collector 7 are also used in the present device.

According to the invention, the device of the present invention is provided in particular as a magnetic field meter, such a magnetic field meter including not only the described device made up of the two LMTs 1,2 but also an evaluation circuit or a trigger circuit.

In addition, a highly sensitive magnetic field detector or magnetic field meter or the device of the present invention may be used for current measurement, by measuring the magnetic field effect around a current-carrying conductor being used.

What is claimed is:

1. A device for detecting a magnetic field, comprising:
   a first lateral magnetotransistor; and
   a second lateral magnetotransistor,
   wherein the first and second lateral magnetotransistors are complementary.

2. The device of claim 1, wherein the first lateral magnetotransistor is npn type and the second lateral magnetotransistor is pnp type.

3. The device of claim 1, wherein the first lateral magnetotransistor has a first output and a second output, the second complementary lateral magnetotransistor has a third output and a fourth output, and wherein the first output and the third output are connected via low resistance, the second output and the fourth output are connected via low resistance, and wherein a measuring bridge is provided between the first output and the fourth output.

4. The device of claim 3, wherein the first output and the third output are complementary, and wherein the second output and the fourth output are complementary.

5. The device of claim 4, wherein the first output and the second output are collector terminals of the first lateral magnetotransistor, and wherein the third output and the fourth output are collector terminals of the second lateral magnetotransistor.

6. The device of claim 3, wherein the first output and the second output are collector terminals of the first lateral magnetotransistor, and wherein the third output and the fourth output are collector terminals of the second lateral magnetotransistor.

7. The device of claim 1, wherein the first lateral magnetotransistor and the second lateral magnetotransistor are monolithically integrated.

8. The device of claim 1, wherein the device is for use in a magnetic field meter.

9. The device of claim 8, wherein the magnetic field meter incorporating the device is in turn incorporated in an ammeter.

10. The device of claim 1, wherein the device is for use in an ammeter.

* * * * *